US012730956B2

(12) United States Patent
Annamalai et al.

(10) Patent No.: US 12,730,956 B2
(45) Date of Patent: Sep. 8, 2026

(54) METHOD AND SYSTEM FOR PROVIDING FAULT TOLERANT LAYOUT OF MASSIVELY PARALLEL PROCESSING ARRAY

(71) Applicant: Cornami, Inc., Dallas, TX (US)

(72) Inventors: Muthiah Annamalai, Dallas, TX (US); Steven Knapp, Dallas, TX (US); Syed Ahmed, Dallas, TX (US); Paul L. Master, Dallas, TX (US); Martin Alan Franz, II, Dallas, TX (US); Tu Nghiem, Dallas, TX (US)

(73) Assignee: Cornami, Inc, Campbell, CA (US)

( * ) Notice: Subject to any disclaimer, the term of this patent is extended or adjusted under 35 U.S.C. 154(b) by 731 days.

(21) Appl. No.: 18/054,460

(22) Filed: Nov. 10, 2022

(65) Prior Publication Data

US 2024/0160825 A1 May 16, 2024

(51) Int. Cl.
*G06F 30/392* (2020.01)

(52) U.S. Cl.
CPC .................................. *G06F 30/392* (2020.01)

(58) Field of Classification Search
CPC ...... G06F 30/30; G06F 30/392; G06F 30/394; G06F 30/398; F06F 30/39; H10D 89/10
USPC .......................................................... 716/119
See application file for complete search history.

(56) References Cited

U.S. PATENT DOCUMENTS 8,977,595 B1 3/2015 Leonard
2003/0056163 A1 3/2003 Rajsuman
2009/0094481 A1 4/2009 Vera
2010/0275171 A1* 10/2010 Pannala .................. G06F 30/39 716/111
2010/0325485 A1 12/2010 Kamath
2013/0159799 A1* 6/2013 Brown ................ G06F 11/2242 714/E11.155
2019/0372831 A1 12/2019 Alvarez-Icaza Rivera
2021/0232407 A1 7/2021 Liu
2021/0303426 A1* 9/2021 Liu ..................... G06F 11/2242
2022/0245082 A1* 8/2022 Vijayashekar ...... G06F 13/4027
2024/0274225 A1* 8/2024 Kim ....................... G11C 29/02

FOREIGN PATENT DOCUMENTS

WO 2022199390 A1 9/2022

OTHER PUBLICATIONS

International Search Report and Written Opinion issued in PCT/US2023/079295, mailed Feb. 27, 2024, pp. 1-14.

* cited by examiner

*Primary Examiner* — Paul Dinh
(74) *Attorney, Agent, or Firm* — Marisa Whitaker

(57) ABSTRACT

A system and method to create a robust topology of a layout of cores for performing a function on an array of cores arranged in a grid is disclosed. A defective core file of location of defective cores in the array and an optimal ideal topology of a configuration layout of at least some of the cores is input. The location of at least one defective core of the array is determined. At least some of the cores in the array of cores are assigned to the optimal initial topography of cores in the array. It is determined whether at least one defective core is in the optimal initial topography. The functions of the cores in the row and the column of the at least one defective core are assigned to additional neighboring cores in the array of cores to create the robust topology.

14 Claims, 11 Drawing Sheets

Step 2: Expansion of Original Topology, Topology B for out = (a * b > 15)

810
814
812
a
b
*
W
>
out
FracTLcore #1 Configured to do an "Addition"
FracTLcore #3 Configured to do a "Wire" (pass thru) Expansion Core
FracTLcore #2 Configured to do be a "Comparison"

METHOD AND SYSTEM FOR PROVIDING FAULT TOLERANT LAYOUT OF MASSIVELY PARALLEL PROCESSING ARRAY

TECHNICAL FIELD

The present disclosure relates generally to applications run by multi-core systems. More particularly, aspects of this disclosure relate to techniques to select cores on an array to avoid cores that have manufacturing defects.

BACKGROUND

Computing systems are increasing based on homogeneous cores that may be configured for different executing applications. Thus, such cores may be adapted for many different operations and be purposed for various parallel programming tasks. The cores are typically fabricated on a die. Such dies may be fabricated so they may be divided to allocate the needed processing power. The processing performed by such dies thus relies on many cores being employed to divide programming operations. One example of such division may be a streaming model of programming multiple cores that employs different threads that are assigned to different cores.

Such dies therefore have an array of cores that may be selectively employed for different operations such as for massively parallel processing. Groups of the cores are selected for such different operations. Efficient layout selects cores in as close as proximity as possible for the execution of the operations. One problem with dies with massive numbers of cores, is the possibility of defects from fabrication or manufacture. For example, a Massively Parallel Processing Array (MPPA) containing 8192 cores may suffer from manufacturing or environmental defects causing it have a less than 100% yield on the usable cores. When configuring the cores for different applications, cores with defects cannot be incorporated into the application.

Suitable testing of the MPPA chips during verification will provide board maps for each chip. However, as of now, there is no algorithm available that can reconfigure a configuration that includes one of the defective cores. Thus, when laying out the cores, the problem of loading an application topology with placements determined by an expert user or automatically by a Place & Route (PR) or mapping tool is an expensive solution to NP-hard problems. Such solutions cannot be recomputed at time of the dynamic loading onto a potentially incomplete yield massively parallel processing array (MPPA) in a quick manner to compensate for the absolute positions in the mapping that may not be available on the multi-core chip due to incomplete or non-functional cores. The topology placement of a solution is a non-deterministic polynomial time (NP) hard static-scheduling problem for a compiler and cannot be reliably or quickly resolved in case of a defective core in the MPPA.

Thus, there is a need for a technique for producing a fault-tolerant layout for Massively Parallel Processing Array (MPPA) topologies that incorporates the Hilbert-Hotel inspired method. There is a further need for a method to deliver the designed functionality of core topology in spite of the designed cores being unavailable. There is also a need to provide a simple solution to the problem of automatically loading an application topology and relying on placements determined by an expert user or automatically by a Place & Route (PR) tool to avoid defective cores.

SUMMARY

One disclosed example is a method to create a robust topology of a layout of cores for performing a function on an array of cores arranged in a grid. The location of at least one defective core of the array is determined. At least some of the cores in the array of cores are assigned to a configuration layout of an optimal initial topography of cores in the array. It is determined whether the at least one defective core is in the configuration layout of the optimal initial topography. The functions of the cores in the row and the column of the at least one defective core are assigned to additional neighboring cores in the array of cores to create the robust topology.

Another disclosed example is a system to determine a robust topology to configure an array of cores. The system includes a storage device storing a core defect file including the locations on the array of cores of at least one defective core, and an ideal topology of a configuration layout of at some of the array of cores. A layout module is operable to configure cores on the array of cores according to the ideal topology. The layout module determines the location of at least one defective core in the configured cores on the array from the core defect file. The layout module assigns the functions of the cores in the row and the column of the at least one defective core to additional neighboring cores in the array of cores to create the robust topology.

Another disclosed example is a method of increasing yields of dies fabricated on a wafer. An array of cores having more cores than a target number of cores for each die is fabricated on the wafer. The array of cores on a die is tested. The location of at least one defective core on the die is determined. The cores of a row and a column including the at least one defective core is determined. At least some of the cores in the row and the column are bypassed to provide the target number of cores.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
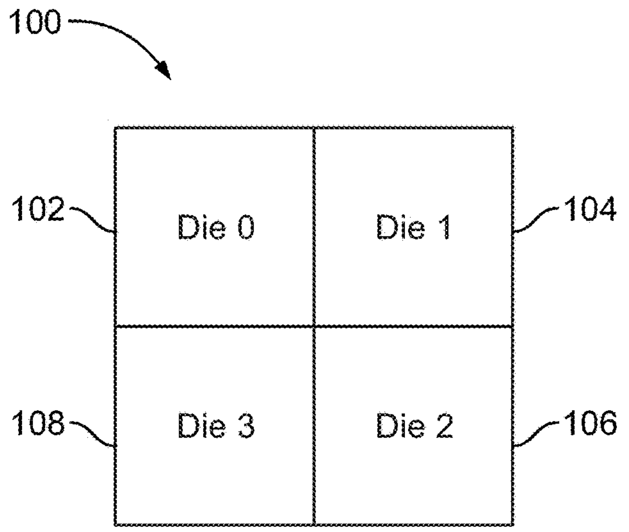
FIG. 1A is a diagram of a chip having four dies each having multiple processing cores.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed toward a technique for producing a fault-tolerant layout of MPPA (Massively Parallel Processing Array) topologies using the Hilbert-Hotel inspired method. The disclosed process can be used in conjunction with a core-loader following the disclosed algorithm to deliver the designed functionality of the user topology in spite of the designated core resources from an absolute position placement of the topology being unavailable. The example technique provides a simple alternative to loading an application topology with placements determined by an expert user or automatically by a place and route tool on a massively parallel processing array (MPPA) with defective cores. The disclosed process utilizes a fault tolerant algorithm based on the Hilbert-Hotel method and a contraction algorithm to rearrange a layout of cores in an ideal topology to produce a robust topology in a quick manner. Thus, the disclosed process allows rapid placement of a pre-configured topology on an array of cores to avoid the incorporation of unknown (in the topology) defective cores in the placement.

The present disclosure provides a polynomial complexity solution to a non-deterministic polynomial time (NP) hard problem, which can boost the utility of semiconductor multi-core chip across demanding applications, and increase yield-rate of chip production by accepting more defective cores in a die, thereby reclaiming a higher fraction of usable chips from a manufactured wafer.

FIG. 1A shows an example chip 100 that is subdivided into four identical dies 102, 104, 106, and 108. Each of the dies 102, 104, 106, and 108 include multiple processor cores, support circuits, serial interconnections and serial data control subsystems. For example, the dies 102, 104, 106, and 108 may each have 4,096 processing cores as well as SERDES interconnection lanes to support different communication protocols. There are die to die parallel connections between the dies 102, 104, 106 and 108. Thus, each of the dies 102, 104, 106, and 108 in this example are interconnected by Interlaken connections. The chip 100 is designed to allow one, two or all four of the dies 102, 104, 106, and 108 to be used. The pins on a package related to un-used dies are left unconnected in the package or the board. The dies are scalable as additional chips identical to the chip 100 may be implemented in a device or a circuit board. In this example, a single communication port such as an Ethernet port is provided for the chip 100. Of course, other ports may be provided, such as one or more ports for each die.

Figure 1B:
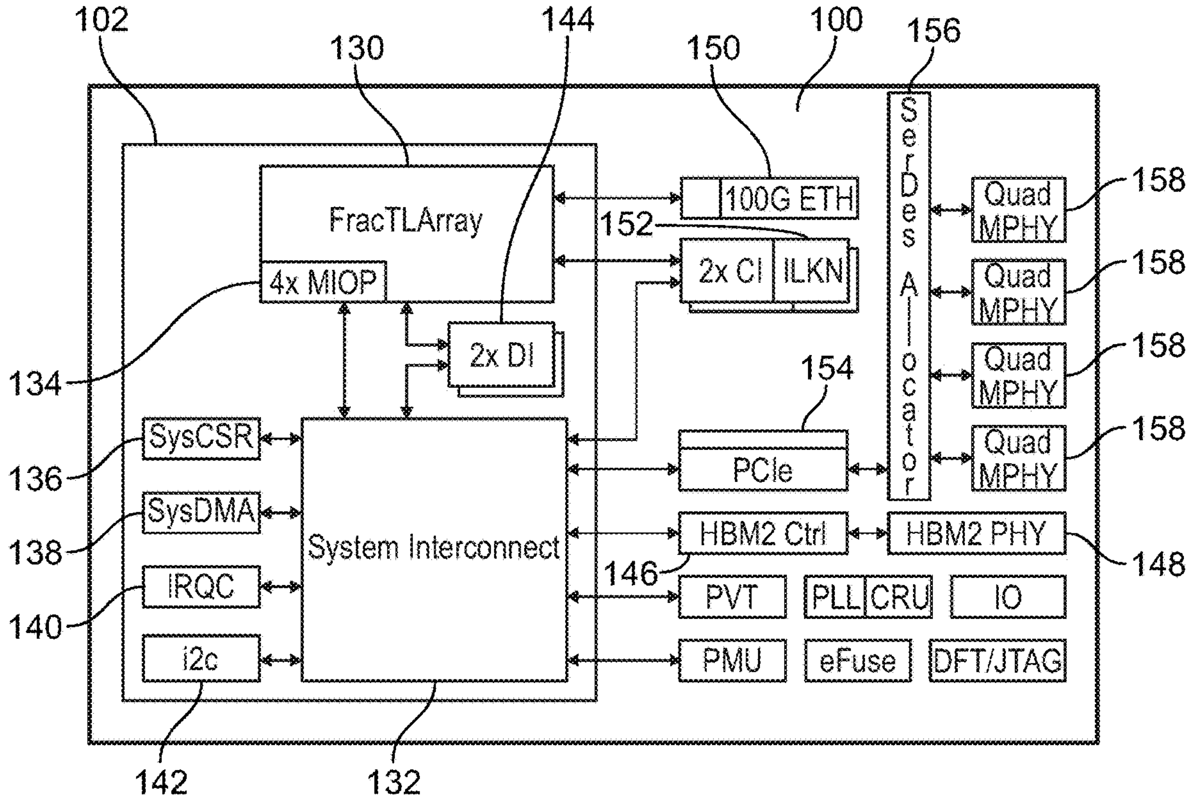
FIG. 1B is a simplified diagram of one of the dies on the chip shown in FIG. 1A.

FIG. 1B is a block diagram of one example of the die 102. The die 102 includes a fractal array 130 of processing cores. The processing cores in the fractal array 130 are interconnected with each other via a system interconnect 132. The entire array of cores 130 serves as the major processing engine of the die 102 and the chip 100. In this example, there are 4096 cores in the fractal array 130 that are organized in a grid.

The system interconnection 132 is coupled to a series of memory input/output processors (MIOP) 134. The system interconnection 132 is coupled to a control status register (CSR) 136, a direct memory access (DMA) 138, an interrupt controller (IRQC) 140, an I2C bus controller 142, and two die to die interconnections 144. The two die to die interconnections 144 allow communication between the array of processing cores 130 of the die 102 and the two neighboring dies 104 and 108 in FIG. 1A.

The chip includes a high bandwidth memory controller 146 coupled to a high bandwidth memory 148 that constitute an external memory sub-system. The chip also includes an Ethernet controller system 150, an Interlaken controller system 152, and a PCIe controller system 154 for external communications. In this example each of the controller systems 150, 152, and 154 have a media access controller, a physical coding sublayer (PCS) and an input for data to and from the cores. Each controller of the respective communication protocol systems 150, 152, and 154 interfaces with the cores to provide data in the respective communication protocol. In this example, the Interlaken controller system 152 has two Interlaken controllers and respective channels. A SERDES allocator 156 allows allocation of SERDES lines through quad M-PHY units 158 to the communication systems 150, 152 and 154. Each of the controllers of the communication systems 150, 152, and 154 may access the high bandwidth memory 148.

In this example, the array 130 of directly interconnected cores are organized in tiles with 16 cores in each tile. The array 130 functions as a memory network on chip by having a high-bandwidth interconnect for routing data streams between the cores and the external DRAM through memory IO processors (MIOP) 134 and the high bandwidth memory controller 146. The array 130 functions as a link network on chip interconnection for supporting communication between distant cores including chip-to-chip communication through an "Array of Chips" Bridge module. The array 130 has an error reporter function that captures and filters fatal error messages from all components of array 130.

Figure 2A:
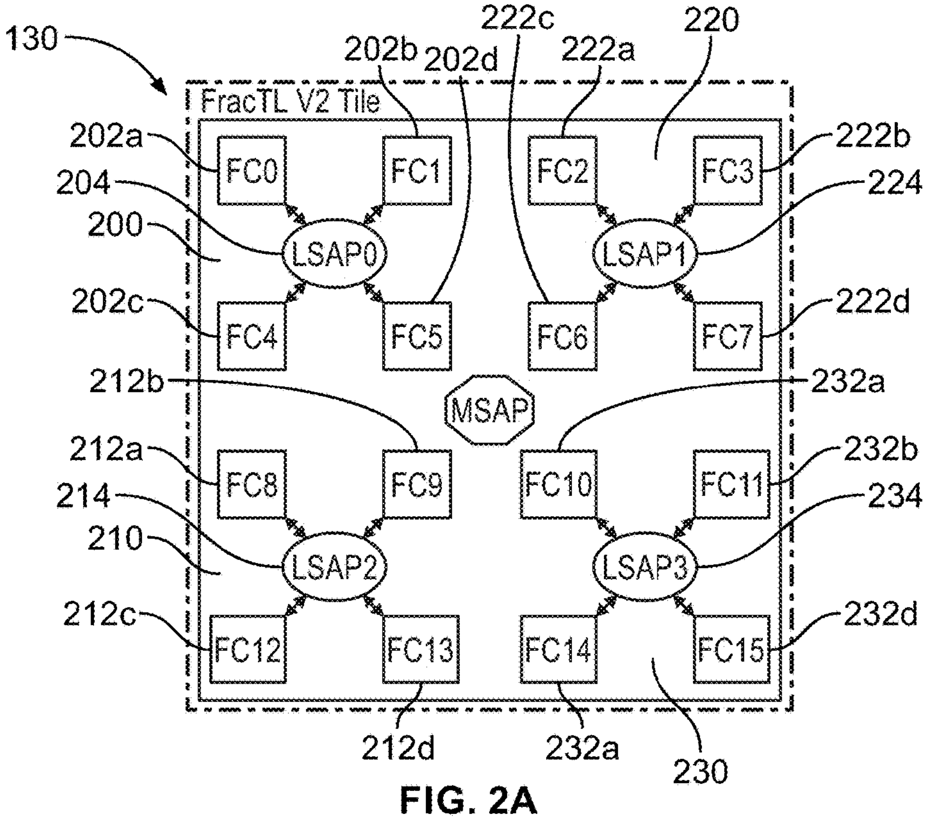
FIG. 2A is a block diagram of the array of cores in the die in FIG. 1B.
Figure 2B:
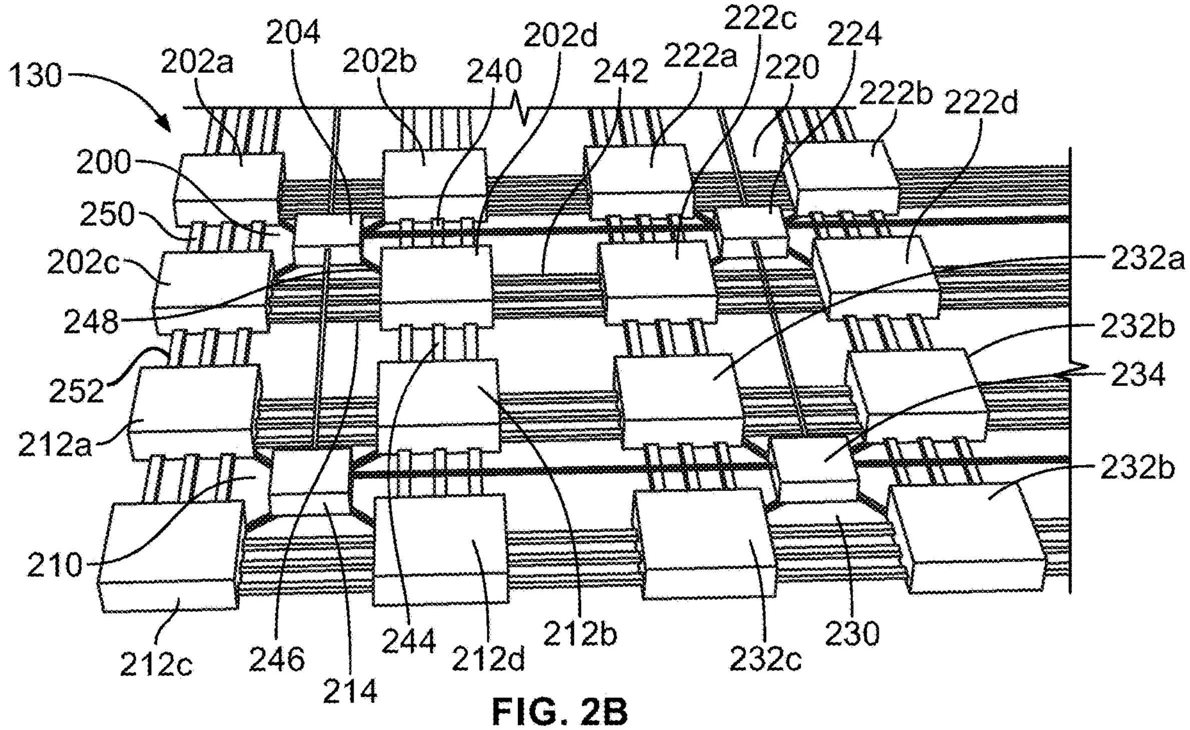
FIG. 2B is a three-dimensional view of the array of cores in the die in FIG. 1B.

FIG. 2A is a detailed diagram of a section of the array of cores 130 in FIG. 1B. FIG. 2B is a three-dimensional image of the section of the array of cores 130 in FIG. 1B. The array of cores 130 is organized into four core clusters such as the clusters 200, 210, 220, and 230 shown in FIG. 2A. For example, the cluster 200 includes cores 202*a*, 202*b*, 202*c*, and 202*d*. Each of the four cores in each cluster 200 such as cores 202*a*, 202*b*, 202*c*, and 202*d* are coupled together by a router 204. FIG. 2B shows other clusters 210, 220, and 230 with corresponding cores 212*a*-212*d*, 222*a*-222*d* and 232*a*-232*d* and corresponding routers 214, 224, and 234.

As may be seen specifically in FIG. 2B, in this example, each of the cores 202*a*, 202*b*, 202*c*, and 202*d* has up to four sets of three interconnections. For example, a core in the center of the array such as the core 202*d* includes four sets of interconnections 240, 242, 244, and 246 each connected to one of four neighboring cores. Thus, core 202*b* is connected to the core 202*d* via the interconnections 240, core 222*c* is connected to the core 202*d* via the interconnections 242, core 212*b* is connected to the core 202*d* via the interconnections 244, and core 202*c* is connected to the core 202*d* via the interconnectors 246. A separate connector 248 is coupled to the wire router 204 of the cluster 200. Thus each core in the middle of the array [,] has four sets of interconnections, while border cores such as the core 202*c* only have three sets of interconnections 250, 252, and 246 that are connected to respective cores 202*a*, 212*a*, and 202*d*.

Figure 3:
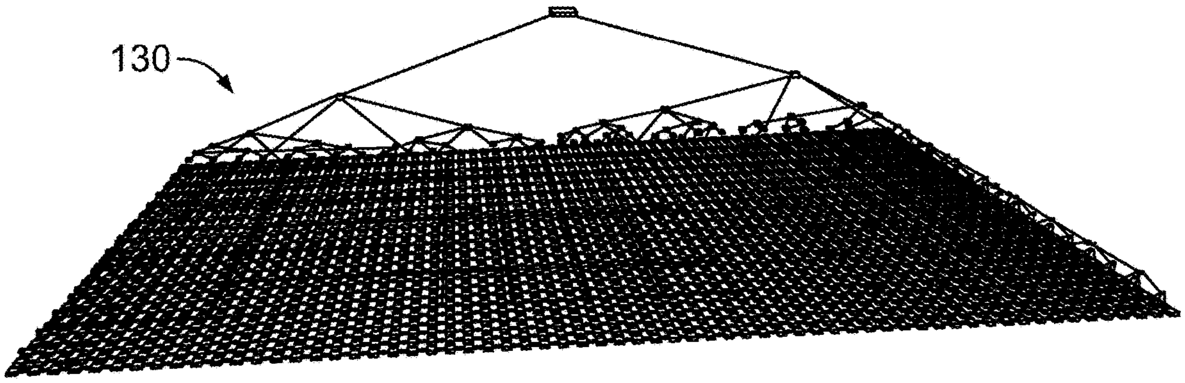
FIG. 3 is a three-dimensional view of the array of cores that is suitable for selection for implementation of different operations.

FIG. 3 is a perspective view of the cores of the array of cores 130. Areas of cores are selected for layout for selected cores that perform a program function such as matrix multiplication. Assuming all the cores are functional, the layout of cores for a program function ideally is as densely laid out as possible. Such an ideal topology may be defined as the layout for a 100% yield MPPA fractal array chip. However, the ideal topology layout needs to be adjusted to avoid including any malfunctioning cores in the array.

Figure 4:
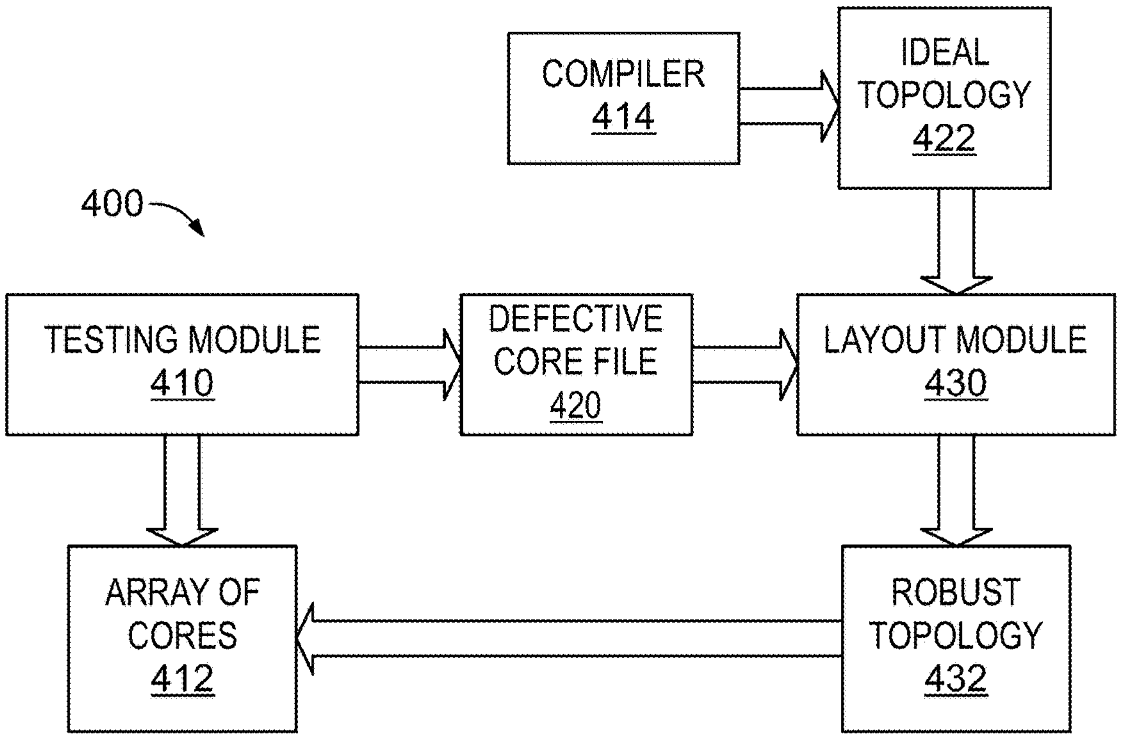
FIG. 4 is a block diagram of a system to provide a robust topology for layout of cores on an array of cores.

FIG. 4 is a block diagram of a system 400 to provide a robust topology for a MPPA fractal core array such as the array of cores 130 on the die 102 in FIG. 1B. The system 400 includes a testing module 410 that tests an array of cores 412 of a MPPA fractal array chip such as the chip 100 in FIGS. 1A-1B. The testing module 410 produces a defective core file 420 that includes the locations of all defective cores on the fractal array of cores 412. A compiler 414 executes compiler tools such as a place and route routine that provides an ideal topology 422 for placement of the cores in the array 412 for the desired operation. Alternatively, the ideal topology 422 may be prepared by an expert user manually.

The ideal topology 422 for layout configuration of at least some of the cores of the array of cores 412 to perform desired operations or functions is read by a layout module 430. The layout module 430 reads the defective core file 420 and using the example fault-tolerant algorithms, produces a robust topology 432 that is then applied to the array of cores 412. The application of the robust topology 432 allows the array of cores 412 to perform the configured operations and avoids using any defective cores in the layout configuration.

Three example algorithms enable applying an ideal topology toward a MPPA fractal array chip with one or more defective cores. The example algorithms include a fault-tolerant algorithm, a contraction algorithm, and a master algorithm. The master algorithm applies the fault-tolerant algorithm and taps a contraction routine to enable retrieval of more cores for other computations. This can help where there are multiple topologies configured in different areas on the example MPPA fractal array chip such as the chip 100 (a multi-tenant situation). These example techniques can be adapted to the problem of adjusting a topology to avoid a defective core in a fractal array as explained above. The example techniques may also be applied to a network on chip (NOC) router failure scenario where a block of 2×2 fractal cores becomes unavailable due to the router failure. The effected cores from the router failure can only act as wires and become unavailable to the place and route/layout causing displacement of ideal layout topologies.

An example step-over algorithm can be applied to abandon a row and column of NOC routers and reconfigure unused cores to maintain the function of the topology. This fault-tolerance mechanism may allow recovery of limited cores in an otherwise discarded chips since topologies may be designed to incorporate functional cores despite relatively large numbers of faulty cores. Another application may be to apply the disclosed routine to provide yield improvement for whole chip fabrication since even a chip with a relatively large number of faulty cores may still be used with different topologies using the above mentioned techniques. Thus, the threshold number of faulty cores to reject a chip from production may be raised, resulting in higher chip yields from a foundry.

The example fault-tolerant loading technique for MPPAs provides a simple solution to modify the solution of a complex NP-hard problem of the placement. The topology placement of a solution is a NP-hard static-scheduling problem for a compiler and cannot be reliably or quickly resolved in case of a defective core in the MPPA.

Applications by users are represented as a topology for the array of cores and form a primitive data-flow-graph (DFG) representation of user computation to be carried out in the hardware accelerator fabric. The directed graph, G may be represented by (V, E) where V is one of the cores or processing elements and E is a bandwidth link representing the nearest neighboring core or a NoC multi-hop network connection to communicate data in and out of the core or processing element. The hierarchy of the layout problem ensures the presence of (processing element or fractal core) operators, or macros as vertices of a graph. i.e. V E {FC}, where FC is the fractal core and V is the processing element or fractal core.

The "Ideal placement" of the ideal topology on the MPPA or fractal array (FA) of cores assumes 100% yield on the MPPA (FA) by the compiler tools that configure the cores in the array for the desired operation. The place and route operation (PR) for the MPPA (FA) may be expressed as:

$$PR(V): V \rightarrow (x,y) \text{ for integer position}$$

Where V is a core and (x,y) is a co-ordinate within the MPPA (FA) area.

Areal MPPA (FA) with a yield of less than 100% of the cores being functional is reported at the time of testing the cores and after tapeout by inspection of the cores. A defectcore-file (DCF) such as the defective core file 420 in FIG. 4 will be output with the defective core positions in coordinates (x, y) of the array of cores for use by the layout tools.

A defective core $V_d$–$(x_d, y_d)$ may be assigned in the ideal layout but is also found to be unmappable in the desired MPPA (FA) since this co-ordinate is also found in the defect-core-file (DCF). In this example, the layout starts from the top-left and proceeds to the bottom-right of the array in a coarse raster method. The displacement to avoid defective cores is inspired by the Hilbert Hotel paradox where new guests are added to a hotel that is already at capacity. The Hilbert Hotel paradox adds new guests by creating new rooms that can be created on demand, a paradoxical degree of freedom. By adapting this method, a technique of using relative displacement of neighbors of defective cores may incorporate the fault-tolerant algorithm (FTL), the contraction algorithm, and the master algorithm.

The Fault-Tolerant Algorithm (FTL) transforms the original ideal topology representing a 100% yield topology ($T_{orig}$) to a robust topology that avoids defective cores ($T_{robust}$). The algorithm may be expressed as FTL: $T_{orig} \rightarrow T_{robust}$. The inputs for the algorithm are a defect-core-file for the MPPA (FA) array of cores and the output is a robust topology. The algorithm considers the defective core site as an origin coordinate of a 2D grid. Relative displacement in the same row or column of the defective core site by one site to the right, or one site to the bottom is used. The row and column cores of the topology in the rows and columns of the defective core are replaced with wire cores.

Next the cores in the original topology of the cores surrounding the defect site in different quadrants are displaced (e.g. quadrants 1, 3, 4 as per standard analytic geometry) by one core to the right, bottom and right-bottom, respectively. The connectivity of the displaced nodes in the quadrants 1, 3, 4 are patched-up (connected) respectively as per the original topology via the wire cores in the rows and columns. The output topology ($T_{robust}$) is then produced.

Figure 5:
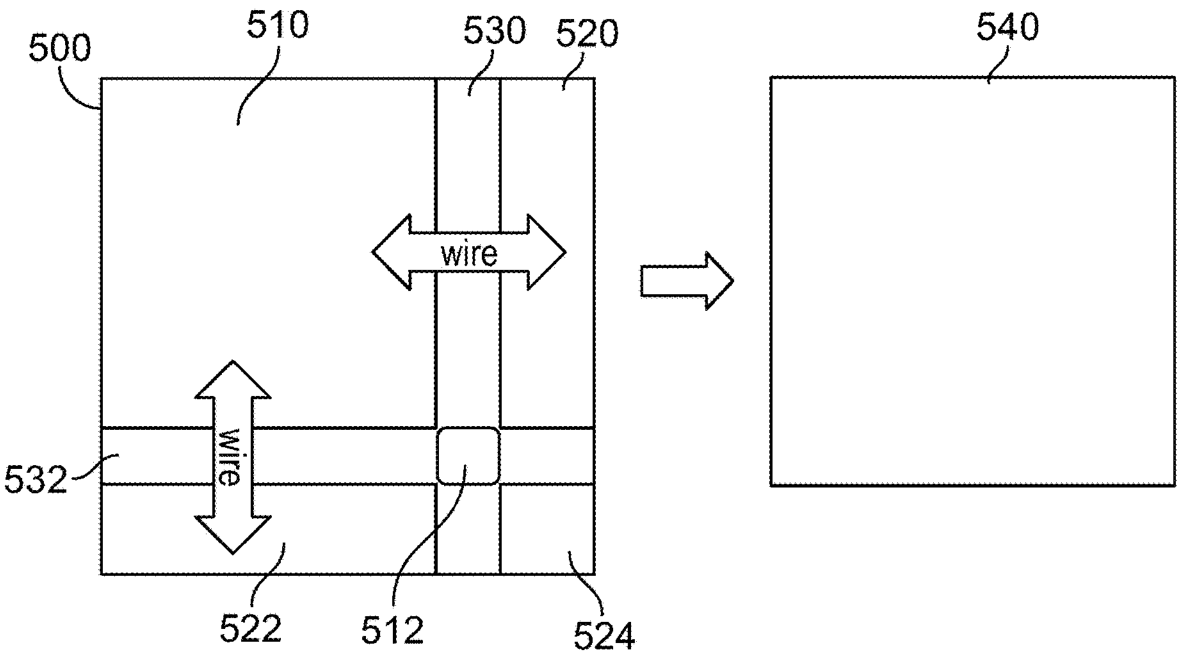
FIG. 5 is a diagram of an area of cores showing the results of an example algorithm to reroute placement due to a defective core.

This technique is based on the Hilbert placement method and illustrated for one defective core as shown in FIG. 5. FIG. 5 shows an initial area 500 of cores that are required for the desired topology. The initial area includes an initial area of functional cores 510. A defective core 512 is present in the initial area 500 required for the desired topology. Thus, the topology is expanded into certain quadrants that include a right quadrant 520, a bottom quadrant 522, and a right bottom quadrant 524.

The site of the defective core 512 is used as the origin of a 2D grid. As shown the cores in the quadrants 520, 522 and 524 are displaced by one core length. This results in a column of cores 530 originating from the defective core 512 and a row of cores 532 originating from the defective core 512. The cores in the column 530 and the row 532 are thus not used in the topology and become "wires" that connect the neighboring cores together. Thus, the original topology is expanded around the defective core 512 to functional cores. After application of the placement method a final topology of active cores 540 that excludes the rows and columns related to the defective core 512 is shown for a defective die that is logically a smaller rectangular grid of exclusively non-defective cores.

Figure 6:
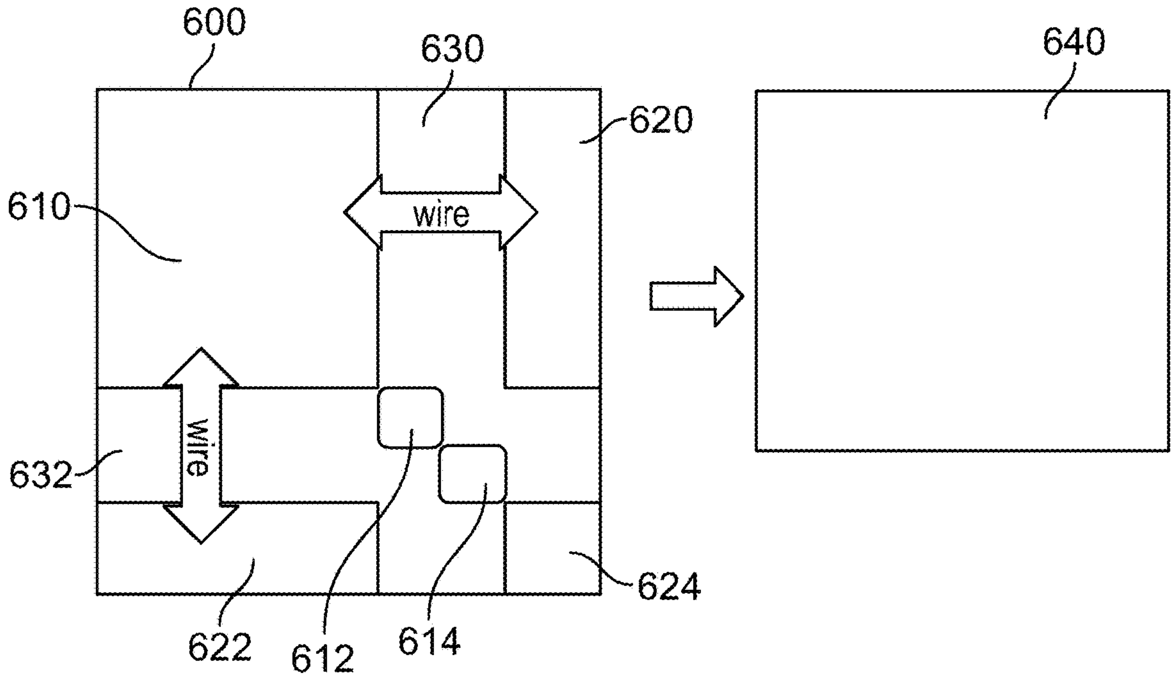
FIG. 6 is a diagram of an area showing the results of an example algorithm to reroute placement due to several defective cores.

The algorithm may also be applied for neighboring defective cores. FIG. 6 shows the application of the algorithm for multiple defective cores. FIG. 6 shows an initial area 600 of cores that are required for the desired topology. The initial area includes an initial area of functional cores 610. Two defective cores 612 and 614 are present in the initial area 600 required for the desired topology. Thus, the topology is expanded into certain quadrants that include a right quadrant 620, a bottom quadrant 622, and a right bottom quadrant 624.

The site of the defective cores 612 and 614 is used as the origin of a 2D grid. As shown the cores in the quadrants 620, 622 and 624 of the topology are displaced by two core lengths because the defective cores 612 and 614 occupy two core lengths. This results in a column of cores 630 of two core lengths originating from the defective cores 612 and 614, and a row of cores 632 of two core lengths originating from the defectives core 612 and 614. The cores in the column 630 and the row 632 are thus not used in the topology and become "wires" that connect the neighboring cores together. Thus, the original topology is expanded around the defective cores to functional cores. After application of the placement method a final topology of active cores 640 is shown for a defective die that is logically a smaller rectangular grid of exclusively non-defective cores.

Figure 7:
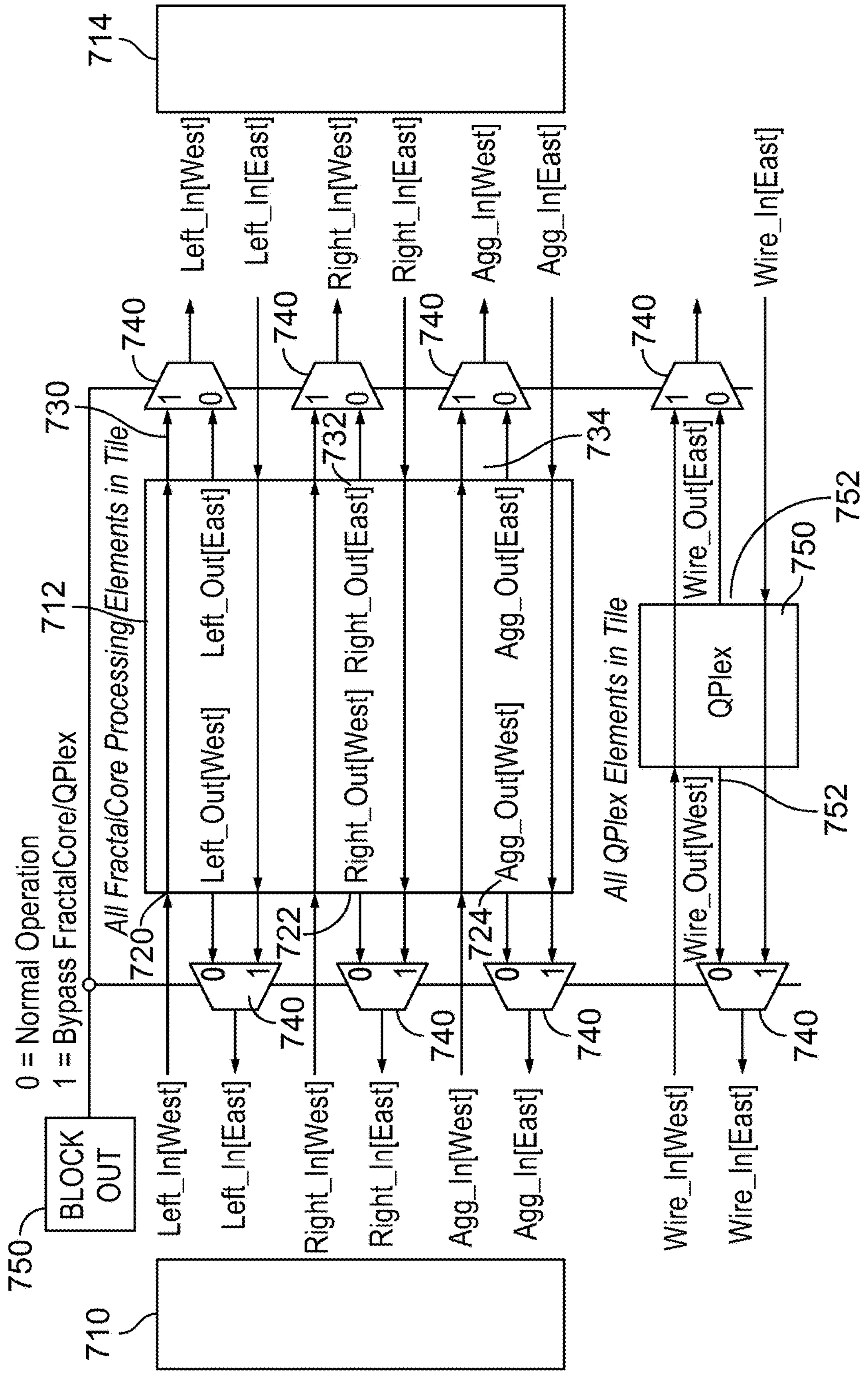
FIG. 7 is an example of rerouting using a step-over routine to bypass defective cores.

FIG. 7 shows an example of the step-over algorithm used to turn cores into "wires" to connect neighboring cores together using top level wires that are typically impervious to low level defects. FIG. 7 shows a series of three cores 710, 712, and 714. The core 712 is defective and thus the step-over algorithm allows this core and the neighboring cores 710 and 714 in the row of cores to become wires such as the row of cores 532 in FIG. 5. The example core 712 includes three inputs, a left input 720, a right input 722, and an aggregator (agg) input 724. The core 712 also includes three outputs, a left output 730, a right output 732, and an agg output 734. As explained above, each core in the array such as the core 712 thus has input and output wires that feed and drain data to and from the core. Additional hardware in the form of logical switches 740 is added to the inputs 720, 722, and 724 and the outputs 730, 732, 734 to allow the wires, under software control, to bypass the core.

The example core 712 includes part of a wire router 750 that includes four input/outputs (e.g., east, west, north, south) such as the input/outputs 752 for network on chip functions. The wire router 750 is also bypassed using the logical switches 740 to bypass the network entry and exit points. In this example, only the east and west input/outputs 752 are shown as bypassed, but the corresponding north and south input/outputs (not shown) are also bypassed.

In this example, the core 710 is physically to the left of the core 712. The core 714 is directly to the right of core 712. In a normal operational mode data to and from the core 710 is sent/received by the core 712, and data to and from the core 714 is send/received by the core 712. When the fault detection algorithm detects a failure of the core 712 and the core is bypassed if it is part of the logical arrangement such as the examples in FIGS. 5-6. Thus, a software routine 750 asserts a hardware signal that "by-passes" the core 712 by sending commands to the logical switches 740 such that all the wires that would have originated or been received by the core 712 are instead skipped over. When the core 712 is "stepped-over," the core 710 directly sends/receives data to and from the core 714.

Simplistically, this allows an entire "row" or "column" to be "skipped over" bypassing the inoperable core as shown in FIGS. 5-6. However, skipping over the row or column that contains a defective core such as the core 512 in FIG. 5, also skips over all the "good" cores in the row 532 and the column 530

A second example algorithm is a contraction algorithm. The contraction algorithm has inputs of a loosely placed topology ($T_{orig}$) based on the expansion algorithm that allows the topology to avoid defective cores and outputs of a tightly placed topology ($T_{optimal}$). The example contraction algorithm seeks out all adjacent runs of two or more wires (cores configured as connectors) in same direction in an MPPA (FA) layout—R, where R is the topology after running the Hilbert-Hotel algorithm. This set has wire cores referred by pointer to objects and not absolute locations (x, y) on the MPPA (FA) since this will be successively update in course of the contraction algorithm. If no such runs of wire cores exist, the algorithm terminates and sets $T_{optimal}=T_{curr}$.

Figure 8:
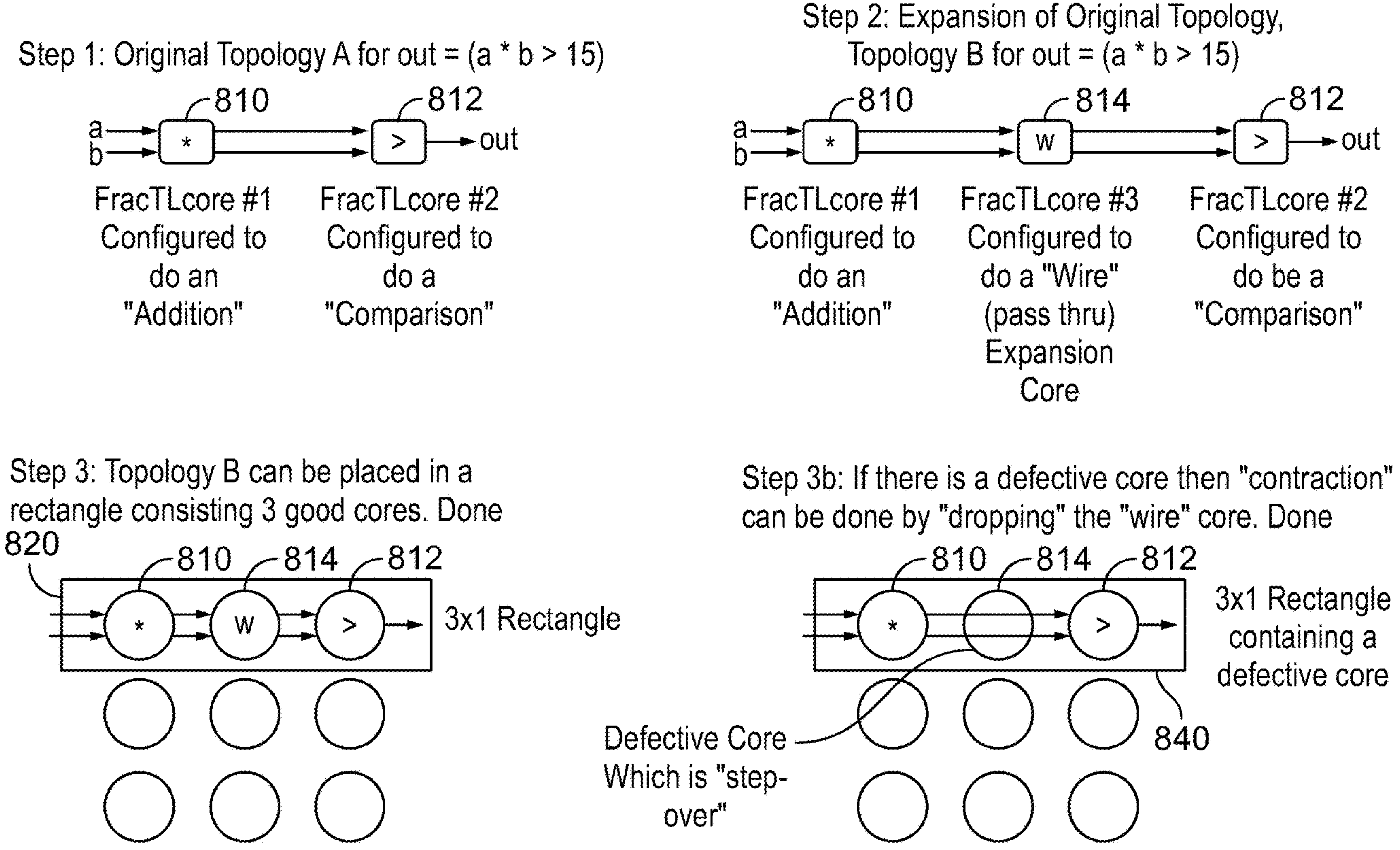
FIG. 8 is an example of expansion and contraction of a core layout for an example function.

FIG. 8 shows an example of the expansion and contraction of cores for a topology that may be placed on groups of cores. The original topology includes a first core 810 that is configured to perform an addition function and a second core configured to do a comparison 812. Thus, the cores 810 and 812 are configured to perform the function of a*b>15. Thus, inputs a and b are feed into the core 810, and the multiplication output based on the addition function is output to the core 812 for an output of the comparison. The original topology may be expanded by adding a third core 814. The core 814 is configured as wire to pass data from the core 810 to the core 814.

Once the original topology is expanded, the next step is to place the expanded topology on the cores. One example of the placement step allows the expanded topology with the three cores 810, 812, and 814 to be placed in a rectangle 820 of three good cores. Alternatively, the expanded topology may be placed on a set of cores including a defective core represented by a rectangle 830. The process described above drops the wire core 814 as a defective core that may be used for the wire core and stepped over through setting the inputs and outputs to bypass the core.

The algorithm marks $T_{curr}=T_{orig}$. For each run of wire found in R, the algorithm identifies if the end block of run is capable of movement to the position at the end of the first wire in that run. Thus the algorithm determines whether the wire satisfies admission criteria for movement such as connectivity preservation across terminals [L, A, R] between cores and directions [N, E, W, S] etc.). If so, this run of wires is contracted by one wire core. The algorithm then moves the affected destination block[s] (block[s] at tail of this run) to be adjacent to the head of this wire. The algorithm manages movement of successors of the destination block[s] by running a depth first search (DFS) and breadth first search (BFS) style reachability algorithm from these nodes and updates their placement positions. If all new placement positions found by the search reachability algorithm are admissible (as non-overlapping and in a non-defective board site) then the board layout can be finalized as expressed by $T_{next}$=Moved[$T_{curr}$]. Thus, when wire core runs are contracted such as a four wire core run contracted to two wire cores connected together {W→W→W→W}=>{W→W}, the contraction may move connectivity of other cores in a negative fashion so as to change topology behavior. In such cases, the search reachability of the algorithm has failed, and the contraction algorithm proceeds to mark this run of wire cores as unmovable, and continues to next available wire core runs.

Thus, if the search reachability algorithm did not admit the contraction of the wire cores, the wire cores participating in the current run are marked as unmovable and the layout of the wires is marked, e.g. set $T_{next}=T_{curr}$. The current node is updated: $T_{curr}=T_{next}$ and additional cores that are designated as wires are evaluated. Once all the wires are evaluated, the contraction algorithm terminates, and the optimal topology is set to the current topology, $T_{optimal}=T_{curr}$.

Figure 9A:
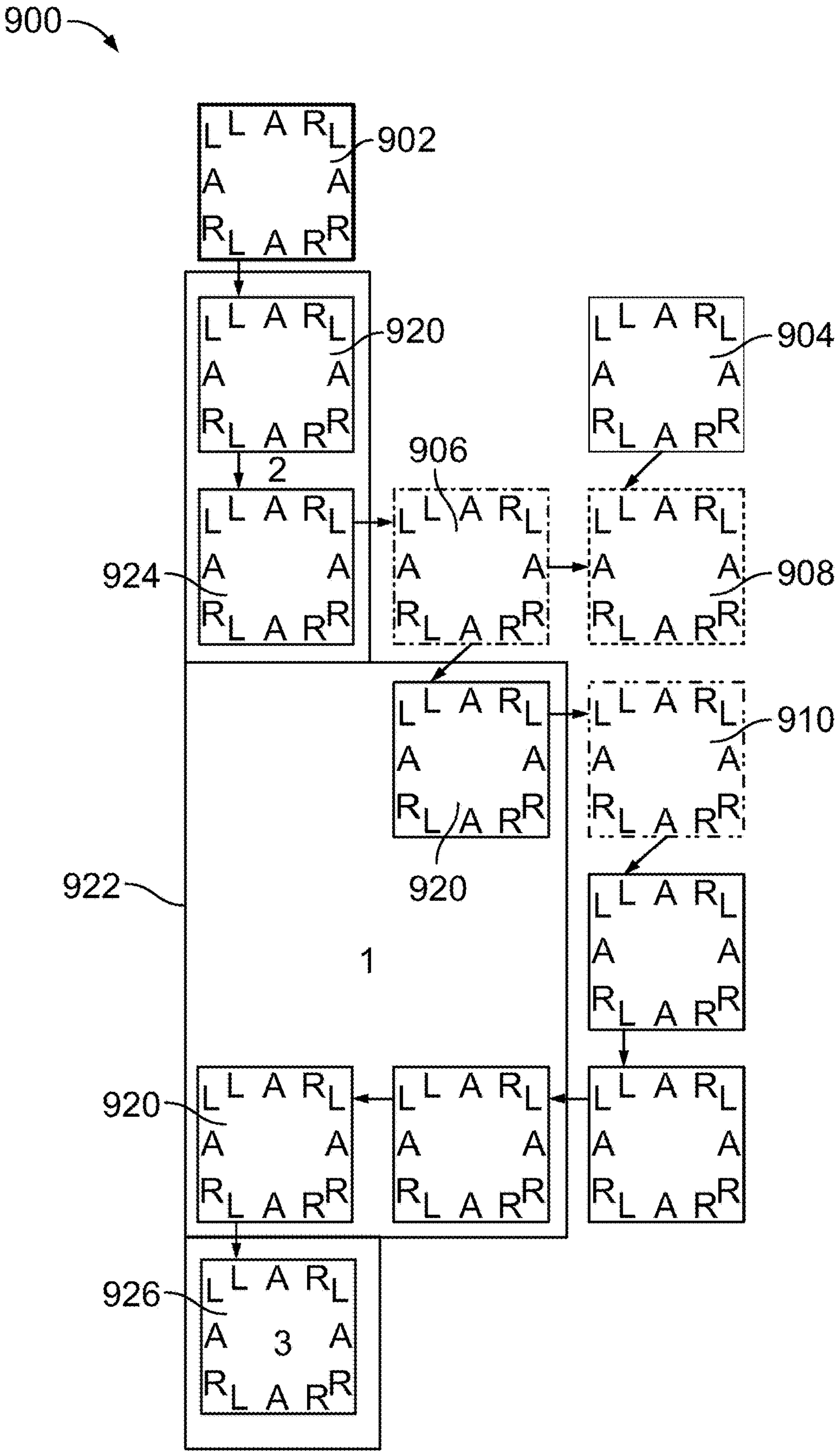
FIG. 9A is an example of a layout of cores that may be compacted according to an example contraction algorithm.
Figure 9B:
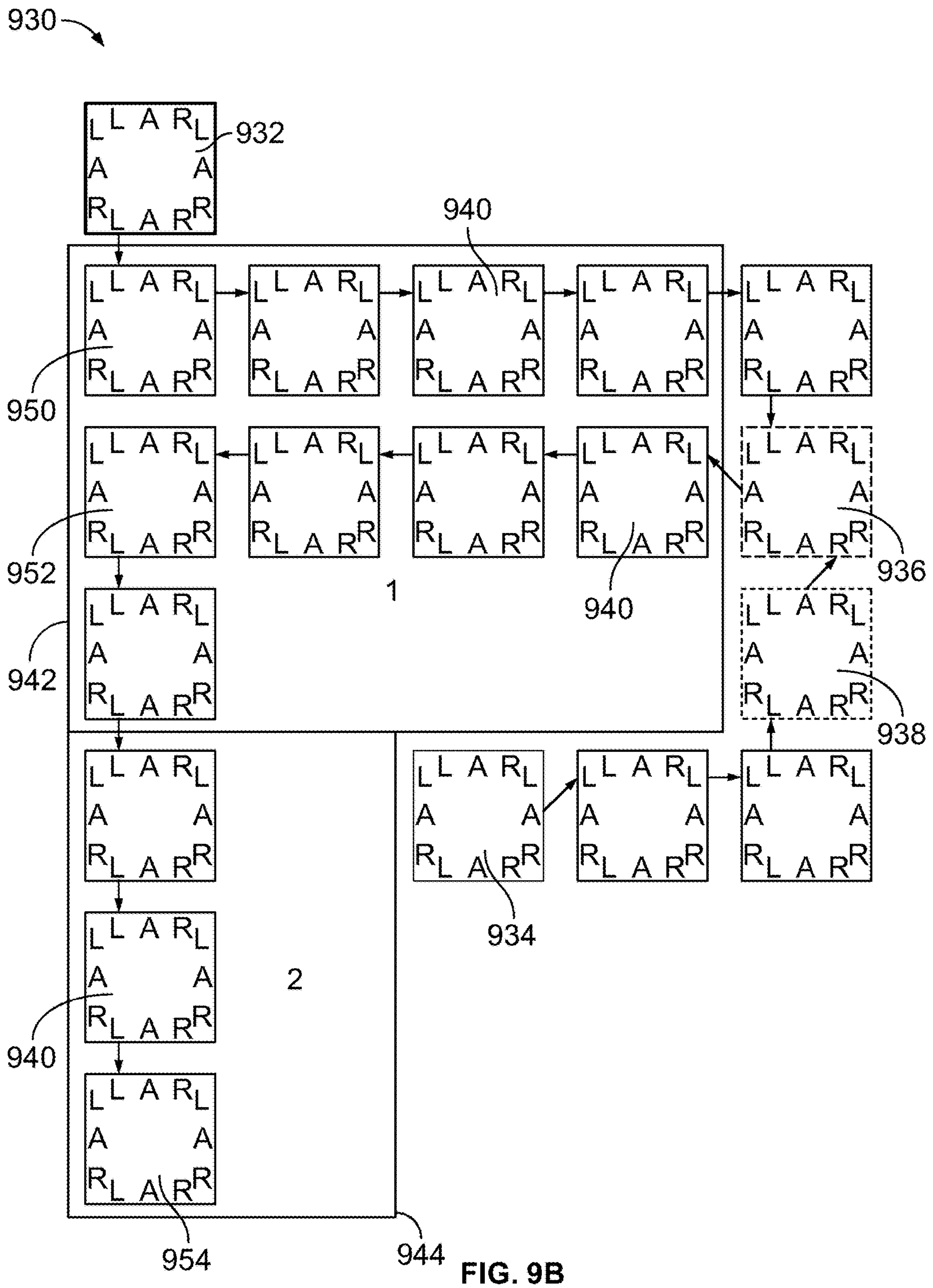
FIG. 9B is another example layout of cores that may be compacted according to an example contraction algorithm.
Figure 9C:
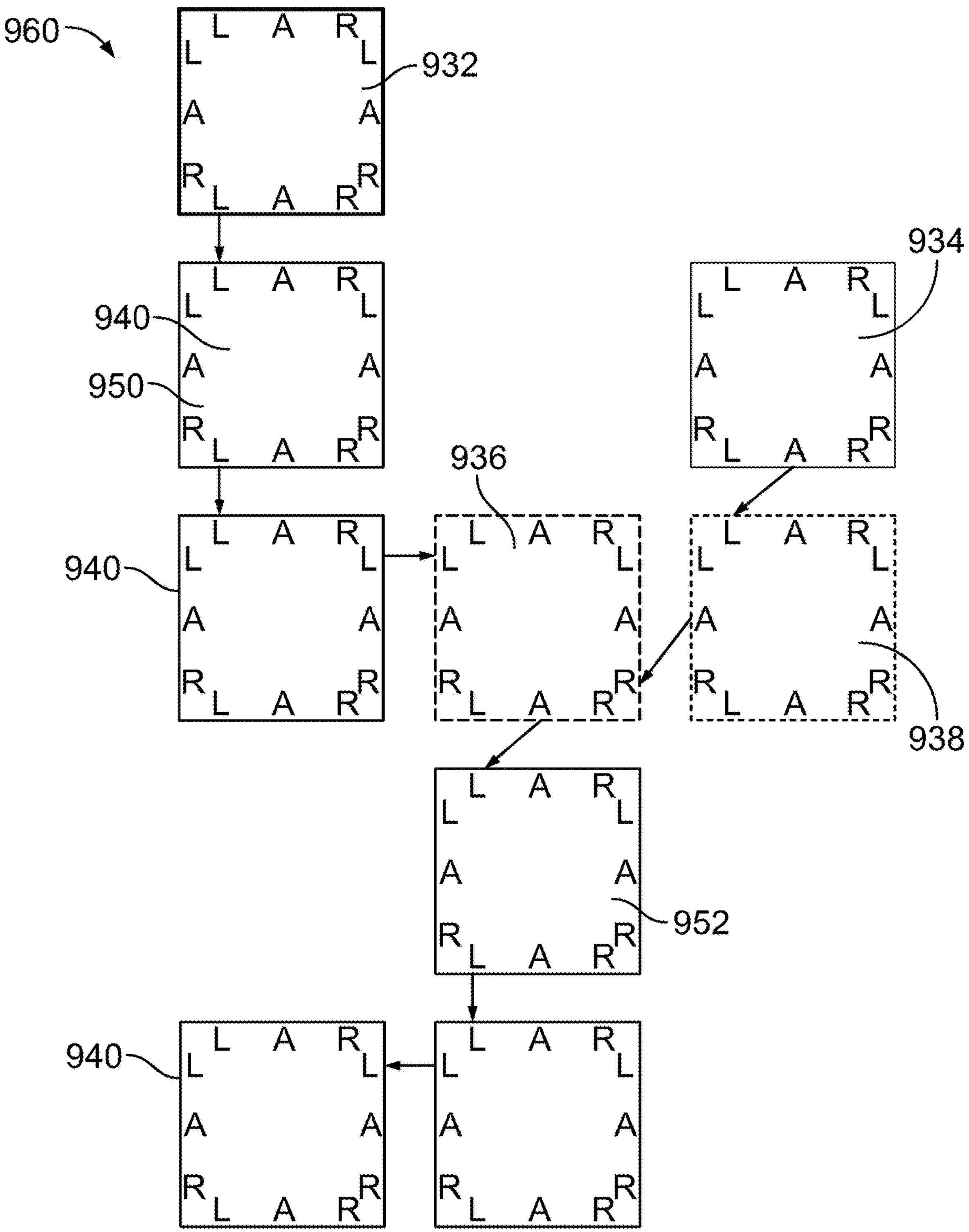
FIG. 9C is a resulting contracted layout of cores from the example layout in FIG. 9B.

FIGS. 9A-9C show examples of different topologies that may be contracted. FIG. 9A is an example topology layout 900 that includes different cores that have been displaced from an initial topology that has been expanded to bypass defective cores. The topology layout 900 includes a constant circular buffer generator core 902, a TSA source/input core 904, an interleaver core 906, a minimum core 908, and a copy L to aggregate core 910. A set of wire cores 920 are distributed throughout the layout 900. The wire cores 920 are grouped into groups 922, 924, and 926 where adjacent runs of wire cores 920 have been detected. Thus, certain spaces such as a row or column of cores in the group 924 include cores that could be contracted. The contraction algorithm thus would review the groups 922, 924, and 926 for spaces for potential contraction of the overall topology 700.

Similarly, FIG. 9B is another example topology 930 that includes different cores. The topology 930 includes a constant circular buffer generator core 932, a TSA source/input core 934, a minimum core 936, and a copy L to aggregate core 938. A series of wire cores 940 are grouped into groups 942 and 944 where adjacent runs of wires have been detected. As shown in group 942, an adjacent run 950 of wire cores is present as well as another adjacent run 952 of other wire cores. In addition, in group 944, an adjacent run of wire cores 954 exists.

FIG. 9C shows a contracted topology 960 produced by the contraction algorithm applied to the topology 930 in FIG. BB. The adjacent run 950 of wire cores in FIG. 9B may be contracted allowing the L output of the core 932 to be sent through a single wire core 940 that is connected to an original wire core 940 was connected to the L input of the core 936. Similarly, the run of cores 952 in FIG. 9B is contracted to a single wire core 940 in FIG. 9C that connects the A output of the core 936. The contracted topology 960 includes new placements for the remaining wire cores 940 in the groups 942 and 944 once the adjacent runs of wires such as runs 950 and 952 in FIG. 9B have been contracted.

The third example algorithm is a master algorithm. The example master algorithm ties in the various pieces of the full fault-tolerant placement strategy. The algorithm has inputs of a defect-core-file for the MPPA (FA) core and the 100% yield topology ($T_{orig}$) and outputs of a robust topology without the defective core or cores ($T_{robust}$).

The algorithm first runs strongly connected components to group adjacent defects into a cluster while keeping sparsely distributed defects on MPPA (FA) board as independent defect sites. This could be also simple as finding largest rectangle area on the cores composed of wires or unused processing elements. This is because Hilbert-Hotel algorithm requires stepping over defective areas (along rows and columns). Thus, the whole defective cluster is configured as a wire with 4-way connectivity to the neighboring clusters.

The master algorithm then runs the fault tolerant algorithm for the entire MPPA as explained above. After producing the robust topology from the fault tolerant algorithm, the master algorithm runs the contraction algorithm on the most recent robust topology. The output of the contraction algorithm is thus the idea robust topology ($T_{robust}$). Failure of the fault tolerant algorithm indicates an inability to overcome board defects and the topology may be too dense to fit on the MPPA (FA) chip because it has too many faulty cores.

Figure 10:
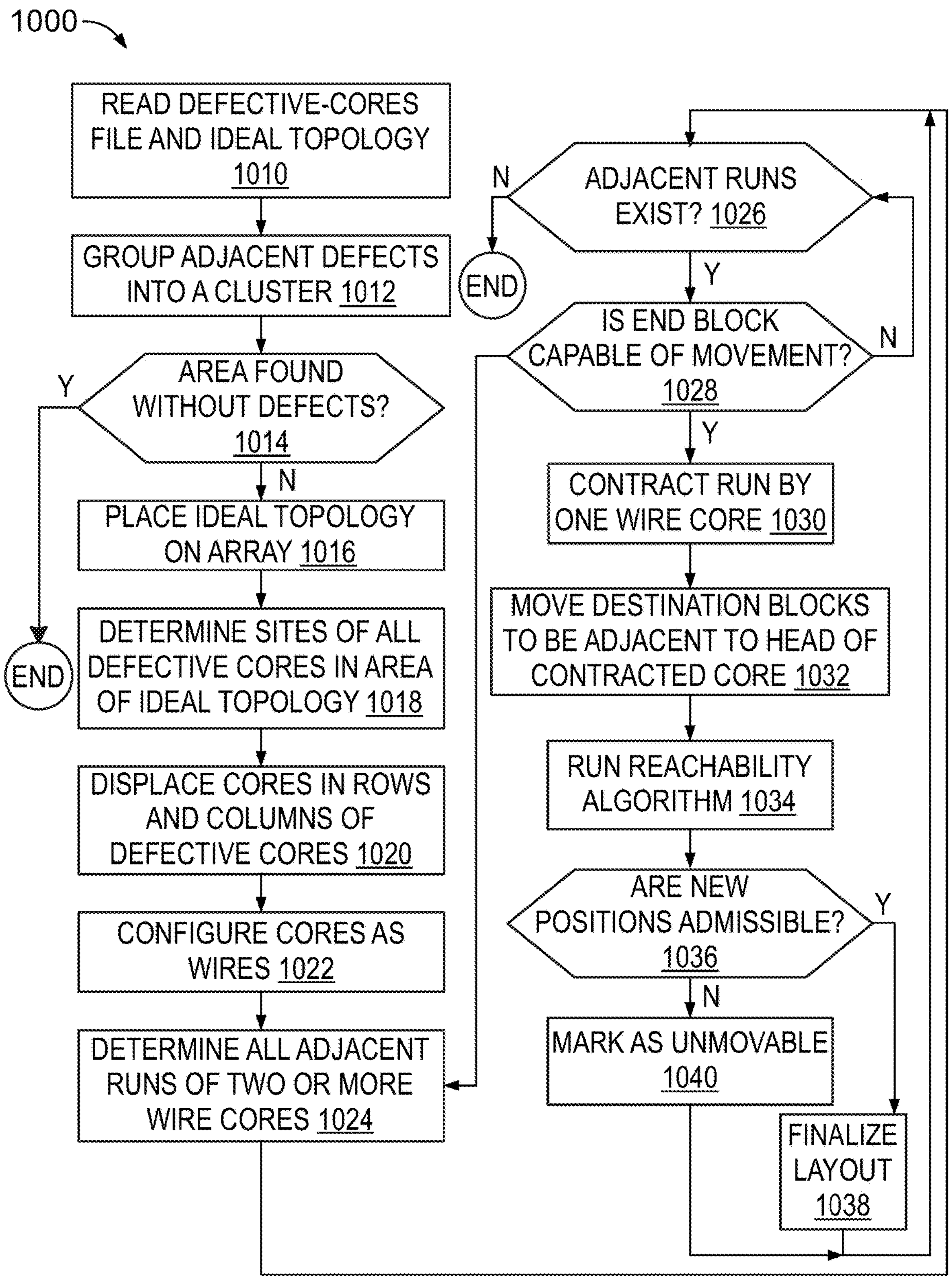
FIG. 10 is a flow diagram of an example master algorithm routine to provide a robust topology for a layout of cores incorporating a fault tolerant and contraction routine.

A flow diagram 1000 in FIG. 10 is representative of example machine readable instructions for the process of determining a robust topology that bypasses defective cores in an array of cores. In this example, the machine readable instructions comprise an algorithm for execution by: (a) a processor; (b) a controller; and/or (c) one or more other suitable processing device(s). The algorithm may be embodied in software stored on tangible media such as flash memory, CD-ROM, floppy disk, hard drive, digital video (versatile) disk (DVD), or other memory devices. However, persons of ordinary skill in the art will readily appreciate that the entire algorithm and/or parts thereof can alternatively be executed by a device other than a processor and/or embodied in firmware or dedicated hardware in a well-known manner (e.g., it may be implemented by an application specific integrated circuit [ASIC], a programmable logic device [PLD], a field programmable logic device [FPLD], a field programmable gate array [FPGA], discrete logic, etc.). For example, any or all of the components of the interfaces can be implemented by software, hardware, and/or firmware. Also, some or all of the machine readable instructions represented by the flowcharts may be implemented manually. Further, although the example algorithm is described with reference to the flowchart illustrated in FIG. 8, persons of ordinary skill in the art will readily appreciate that many other methods of implementing the example machine readable instructions may alternatively be used. For example, the order of execution of the blocks may be changed, and/or some of the blocks described may be changed, eliminated, or combined.

The flow diagram 1000 is the master algorithm for producing a robust topography for a layout configuration of the cores in an array of cores. The routine first reads a defective core file of all defective cores detected in the array of cores and an ideal topology of the layout of cores (1010). The routine then groups adjacent defects into a cluster while keeping sparsely distributed defects on the board as independent sites (1012). The algorithm then reads the ideal topology and determines whether there is a site on the array of cores that can accommodate the topology without including any of the defective core clusters or independent sites (1014). If a site may be found, the topology is assigned to this area and the routine ends. If a site cannot be found, the ideal topology is placed in a selected area (1016).

The routine then determines the sites of all defective cores in the area of the ideal topology placed on the array (1018). The routine displaces the nodes in the rows and columns of any defective cores (1020). The routine then configures any other cores in the rows and columns of the any defective cores as wires to connect the displaced cores with the other cores in the topology (1022).

The routine then determines all adjacent runs of two or more cores configured as wires (1024). The routine determines whether any adjacent runs exist (1026). If no adjacent runs exist, the algorithm terminates. If adjacent runs exist, the routine examines the first adjacent runs and determines whether the end block of the run is capable of movement to the position at the end of the wire core in that run (1028). If the block is not capable of movement, the routine returns to determine whether there are further adjacent runs (1026).

If the block is capable of movement, the routine contracts the run by one wire core (1030). The routine then moves the destination block or blocks to be adjacent to the head of the contracted wire core (1032). The routine then manages movement of successors by running a reachability algorithm to update their placement positions (1034). The routine then determines whether the new placement positions are admissible (1036). If the new placement positions are admissible, the routine finalizes the layout (1038) and returns to determine whether there are further adjacent runs (1026). If the new placement positions are not admissible, the routine marks the wires in the current run as unmovable (1040) and returns to determine whether there are further adjacent runs (1026).

During chip fabrication there are defects that can potentially occur on a silicon die. There is a very high probability that a large silicon die has contains one or more of these defects. The normal procedure is to discard the entire die when this defect occurs—this affects the "yield" or how many "good" or functional dies can one get from a wafer of silicon. By identifying the damaged core, and by adding it to the "defect core file", and by stepping over the bad core during operation allows dead die to become operational and be used.

For example, if an 8,000 core die and a single defect occurs rather than tossing the chip, the step over technique allows us to have a 7,999 core die that is operational. Typically, by keeping a "few" extra cores hidden from the programmer these defects become transparent to the user. For example, the 8,000 core die is really an 8,001 core die. This allows a single defect to handled. Conversely, an 8,002 core die allows 2 defects and so on. Without the step-over mechanism, a defect would generally result in discarding the die. Because the above described techniques allow using the step-over process, dies with defective cores may still be used. The consumer will thus never see the dead cores.

The example techniques are optimal if the cores are relatively small and the wafer yield improvement by fixing defects is large. For example, on a wafer where one core is 0.06 mm squared (0.25 mm×0.25 mm) where the die size for 2048 cores (64×32 cores) is 20 mm×10 mm while the die size for 2145 cores (65×33 cores) with one extra row and extra column added for redundancy is 20.25 mm×10.25 mm. This results in 280 total dies on a wafer of 2048 ICs while there are 269 total dies on a wafer of 2145 ICs. The yield for the 2048 IC wafer (with no redundancy) is 60% which means 168 "good" dies. In contrast, the yield for the 2114 IC wafer with 1 defect redundancy is 96% which means 258 "good" dies. This is a net gain of 90 dies. As the costs per wafer are fixed, adding an extra row and column allows an increase in revenue from a wafer by over 53% (258/168).

There may be several strategies to use the above referenced principles. First, the die may really have 2145 cores (65×33) but the programmer only sees 2048 cores (64×32). Thus, extra cores over a target number of cores (e.g. 2048) have been added to handle defects. For example, a topology that requires a 32×64 rectangle of cores can be fit onto an array of 33×65 cores by taking out one row and one column of cores in hardware to handle a single defect. This does not require another placement of topologies to a rectangle of cores to be run again. No extra software placement step is required which means the placement of the topology is very fast. However, 97 "good" cores in the eliminated row and column are unused to handle the one defective core.

Figure 11:
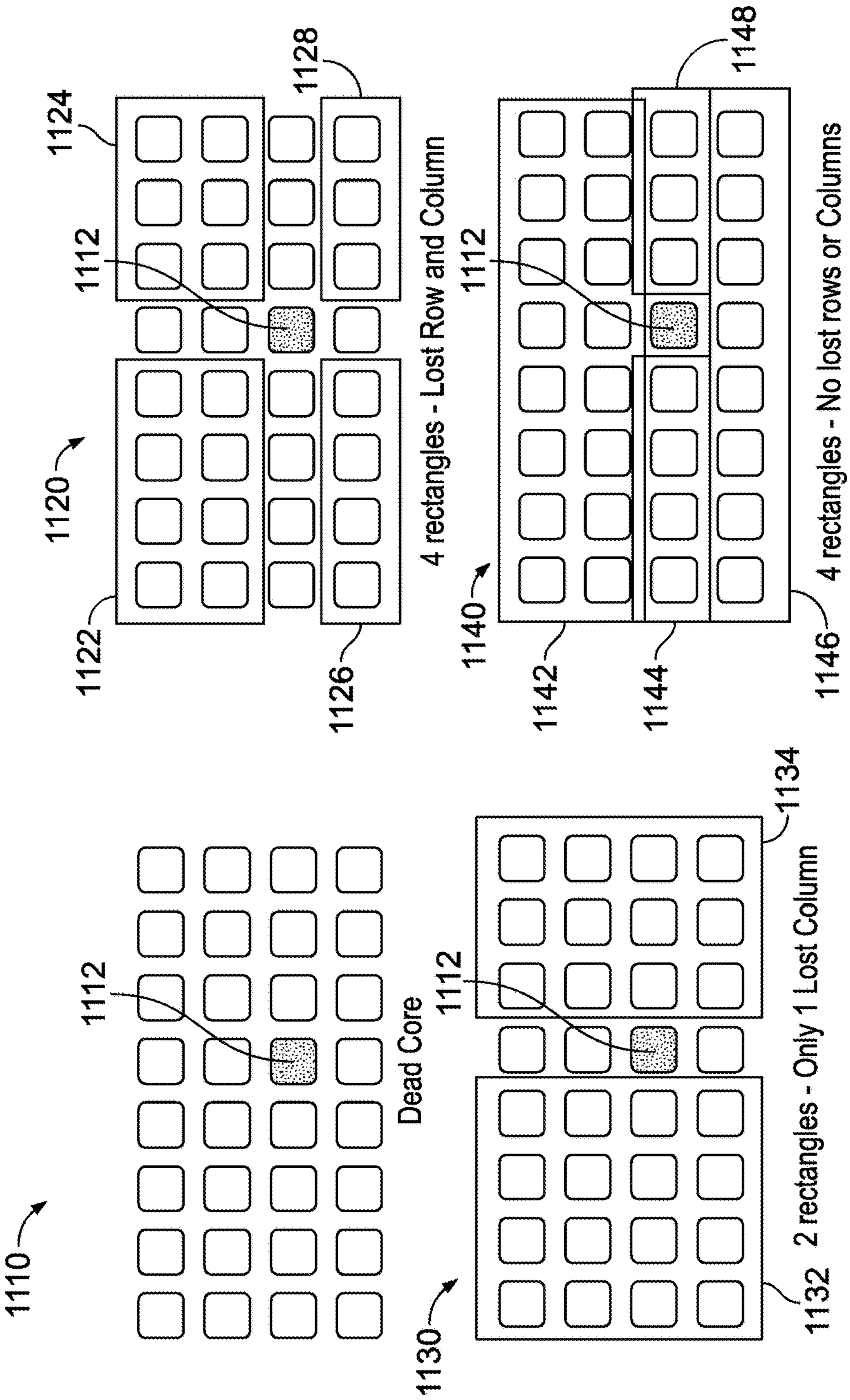
FIG. 11 shows the application of the system in FIG. 4 to increase effective yields of cores fabricated on a wafer.

A second strategy, is allowing a programmer to see that the chip has a variable number of cores. For example, the chip may have either 2145 or 2144 cores (if the die has a defect). FIG. 11 shows an example core array 1100 that includes a defective core 1112. The programmer the runs the software placement step to map a topology on a variable number of cores (2145 or 2144 in this case). In this example, the programmer places the topology onto 4 rectangles that result from taking out a row and column. A simplified example of this strategy is shown in a layout 1120 in FIG. 11 where the topology is placed onto 4 smaller rectangles 1122, 1124, 1126, and 1128. This approach uses 2048 cores that essentially wastes 97 good cores to handle the defective core resulting from taking out a column of 33 cores plus a row of 64 cores.

An alternative is that the topology is then placed onto 2 rectangles by taking out only a single row. A simplified example of this topology is shown in another layout 1130 in FIG. 11. The topology is placed onto 2 smaller rectangles 1132 and 1134. This approach uses 32 good cores to handle the one bad core as it only takes out a single column of 33 cores.

The programmer may alternatively place the topology onto 4 rectangles by taking out only the bad core. A simplified example of this topology is shown in a layout 1140 in FIG. 11. The topology is placed onto 4 smaller offset rectangles 1142, 1144, 1146, and 1148. This results in only wasting the single defective core.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method to create a robust topology of a layout of cores for performing a plurality of functions, wherein each of the cores in the layout of cores is configured to perform at least one of the plurality of functions, the topology created on an array of cores arranged in a grid having a plurality of rows and columns, wherein the layout of cores is subset of the array of cores, the method comprising:

determining the location of at least one defective core of the array associated with a column and a row of the grid;

assigning at least some of the cores in the array of cores to a configuration layout of an optimal initial topography of a subset of cores in the array;

determining whether the at least one defective core is in the subset of cores of the configuration layout of the optimal initial topography; and assigning functions of the cores in the row of the at least one defective core to additional neighboring cores in a neighboring row of the array of cores and assigning functions of the cores in the column of the at least one defective core to additional neighboring cores in a neighboring column to create the robust topology.

2. The method of claim 1, wherein the location of the at least one defective core of the array is determined from a core defect file generated from testing the array of cores.

3. The method of claim 1, further comprising configuring the cores in the row and the column as wire cores connecting the cores of the configuration layout with the additional neighboring cores.

4. The method of claim 3, further comprising:

determining whether any of the wire cores may be contracted; and contracting the determined cores to produce a modified robust topology.

5. The method of claim 1, wherein the initial topology is produced by a place and route algorithm.

6. The method of claim 1, wherein the cores in the array of cores are homogeneous.

7. The method of claim 1, wherein the cores in the array are each coupled to at least one network on chip router, the method further comprising:

determining a network on chip router in the robust topology has failed; and replacing the functions of the cores in the rows and columns of the cores coupled to the failed network on chip router to additional neighboring cores to create a new robust topology.

8. A system to determine a robust topology to configure a layout of cores for performing a plurality of functions, wherein each of the cores in the layout of cores is configured to perform at least one of the plurality of functions, the layout configured on an array of cores arranged in a grid having a plurality of rows and a plurality of columns, the system comprising:

a storage device storing a core defect file including the locations on the array of cores of at least one defective core, wherein the location of the at least one defective core includes a row and a column of the plurality of rows and columns and an ideal topology of a configuration layout of at some of the array of cores;

a layout module operable to:

configure a subset of cores on the array of cores according to the ideal topology;

determine the location of at least one defective core in the subset of configured cores on the array from the core defect file; and assign functions of the cores in the row of the at least one defective core to additional neighboring cores in a neighboring row of the array of cores and assigning functions of the cores in the column of the at least one defective core to additional neighboring cores in a neighboring column to create the robust topology.

9. The system of claim 8, wherein the core defect file is generated from testing the array of cores.

10. The system of claim 8, wherein the layout module is further operable to configure the cores in the row and the column as wire cores connecting the cores of the configuration layout with the additional neighboring cores.

11. The system of claim 10, wherein the layout module is further operable to:

determine whether any of the wire cores may be contracted; and contract the determined cores to produce a modified robust topology.

12. The system of claim 8, wherein the initial topology is produced by a place and route algorithm.

13. The system of claim 8, wherein the cores in the array of cores are homogeneous.

14. The system of claim 8, wherein the cores in the array are each coupled to at least one network on chip router, and wherein the layout module is further operable to:

determine a network on chip router in the robust topology has failed; and replace the functions of the cores in the rows and columns of the cores coupled to the failed network on chip router to additional neighboring cores to create a new robust topology.

* * * * *